(12) United States Patent
Mazzamuto et al.

(10) Patent No.: US 12,325,085 B2
(45) Date of Patent: Jun. 10, 2025

(54) METHOD AND SYSTEM FOR UNIFORMLY IRRADIATING A FRAME OF A PROCESSED SUBSTRATE

(71) Applicant: LASER SYSTEMS & SOLUTIONS OF EUROPE, Gennevilliers (FR)

(72) Inventors: Fulvio Mazzamuto, Gennevilliers (FR); Sylvain Perrot, Gennevilliers (FR); Nabil Douri, Gennevilliers (FR); Guillaume Vincent Thebault, Gennevilliers (FR); Karim Mikaël Huet, Gennevilliers (FR); Guillermo Abraham Gonzalez Trujillo, Gennevilliers (FR)

(73) Assignee: LASER SYSTEMS & SOLUTIONS OF EUROPE, Gennevilliers (FR)

( * ) Notice: Subject to any disclaimer, the term of this patent is extended or adjusted under 35 U.S.C. 154(b) by 908 days.

(21) Appl. No.: 17/476,964

(22) Filed: Sep. 16, 2021

(65) Prior Publication Data

US 2022/0088714 A1     Mar. 24, 2022

(30) Foreign Application Priority Data

Sep. 18, 2020   (EP) ..................... 20306057

(51) Int. Cl.
*B23K 26/352* (2014.01)
*B23K 26/042* (2014.01)
(Continued)

(52) U.S. Cl.
CPC .......... *B23K 26/352* (2015.10); *B23K 26/042* (2015.10); *B23K 26/0643* (2013.01); *H01L 21/02354* (2013.01); *B23K 2101/40* (2018.08)

(58) Field of Classification Search
CPC ............... H01L 21/3247; H01L 21/268; H01L 21/28512; H01L 21/2855; H01L 21/28568;
(Continued)

(56) References Cited

U.S. PATENT DOCUMENTS

| 2001/0040541 A1 | 11/2001 | Yoneda et al. |
| 2002/0047580 A1 | 4/2002 | Kunii et al. |

(Continued)

FOREIGN PATENT DOCUMENTS

| EP | 0 681 316 | 11/1995 |
| JP | 2004363168 A | 12/2004 |

(Continued)

OTHER PUBLICATIONS

Extended Search Report for EP20306057.9, dated Apr. 12, 2021, 8 pages.

(Continued)

*Primary Examiner* — Robert G Bachner
(74) *Attorney, Agent, or Firm* — NIXON & VANDERHYE

(57) ABSTRACT

A method for uniformly irradiating a frame of a processed substrate, the processed substrate including a plurality of frames, two consecutive frames being separated by an intermediate zone, the method includes steps of: determining an initial position of the processed substrate using a detecting unit; comparing the detected initial position with a first predetermined position associated with a first frame of the processed substrate; irradiating the first frame of the processed substrate by an irradiation beam emitted by a source unit and scanned by a scanning unit based on the first predetermined position, the irradiation beam being adapted
(Continued)

to cover uniformly the whole first frame. A system for uniformly irradiating a frame of a processed substrate is also described.

11 Claims, 7 Drawing Sheets

(51) Int. Cl.
    *B23K 26/06*     (2014.01)
    *B23K 101/40*     (2006.01)
    *H01L 21/02*     (2006.01)

(58) Field of Classification Search
    CPC .... H01L 21/324; H10D 30/60; H10D 62/151; H10D 62/83; H10D 64/62; H10D 84/144; A61K 40/436; H02K 15/38
    See application file for complete search history.

(56) References Cited

U.S. PATENT DOCUMENTS

| | | |
|---|---|---|
| 2004/0031779 A1 | 2/2004 | Cahill et al. |
| 2006/0113290 A1 | 6/2006 | Shareef et al. |
| 2006/0183350 A1 | 8/2006 | Kudo et al. |
| 2007/0024787 A1 | 2/2007 | Arai |
| 2008/0121819 A1 | 5/2008 | Tanaka et al. |
| 2009/0272978 A1 | 11/2009 | Liu et al. |
| 2011/0174787 A1 | 7/2011 | Ide et al. |
| 2012/0171876 A1 | 7/2012 | Venturini et al. |
| 2014/0183172 A1 | 7/2014 | Oh et al. |

FOREIGN PATENT DOCUMENTS

| | | |
|---|---|---|
| JP | 2006156915 A | 6/2006 |
| JP | 2008153638 A | 7/2008 |
| JP | 2011119419 A | 6/2011 |
| JP | 2011147968 A | 8/2011 |
| JP | 2012522646 A | 9/2012 |
| TW | 200945446 A | 11/2009 |
| WO | 2018/216281 | 11/2018 |

OTHER PUBLICATIONS

Office Action, issued in Japanese Patent Application No. 2021-149864 dated Feb. 25, 2025.
Office Action, issued in Taiwanese Patent Application No. 110134235 dated Jan. 16, 2025.

METHOD AND SYSTEM FOR UNIFORMLY IRRADIATING A FRAME OF A PROCESSED SUBSTRATE

CROSS REFERENCE TO RELATED APPLICATION

This application claims priority to EP Patent Application No. 20306057.9 filed 18 Sep. 2020, the entire contents of which is hereby incorporated by reference.

BACKGROUND OF THE INVENTION

Field of the Invention

The invention relates to the irradiation of semiconductor substrates.

More precisely the invention relates to a method and a system for uniformly irradiating a frame of a processed substrate.

Description of the Related Art

To manufacture semiconductor devices, a semiconductor substrate is exposed to a pulsed light beam during a process called thermal processing.

A semiconductor substrate is generally formed by a wafer of material which comprises a plurality of frames. Each frame comprises one or more integrated circuits.

During the thermal processing, the irradiation of the plurality of frames must follow some specific rules in order to irradiate each frame uniformly. The irradiation must be managed in order to avoid any overlap (corresponding to two or more irradiations of a frame).

Furthermore, the wafer also has some areas that should not be irradiated. Indeed, the edges of the wafer are fragile and the irradiation could cause damages.

A first known solution is to use an irradiation that is enough to cover the full wafer at the same time. In such a solution, there is no need to manage transition of irradiation from one frame to another. The uniformity is thus performed thanks to the arrangement of the system.

In such a system, a protective ring is used in order to prevent the edges from the irradiation.

However, such system cannot deliver a sufficient energy density to cover the entire wafer at the same time. Furthermore, the irradiation of the protective ring could generate particles that could degrade the wafer.

A second known solution is based on the use of a smaller irradiation that is not enough to cover the full wafer. This smaller irradiation is combined with a scanning stage adapted to move the wafer below the irradiation so that the full wafer is uniformly exposed without interruption. As an alternative, an optical scanning system can be used to move the irradiation in order to uniformly irradiate the wafer without interruption (the wafer is not moved in this alternative). As another alternative, a system comprising a scanning stage and an optical scanning system is adapted to irradiate uniformly the wafer (with the smaller irradiation).

However, using a scanning stage is only adapted for slow scanning process as said scanning stage is generally heavy. Furthermore, it is quite difficult to achieve an accurate scanning process with such systems. Finally, the synchronization of the movements of the scanning stage and the optical scanning system is quite complex to control.

SUMMARY OF THE INVENTION

Therefore one object of the invention is to provide a method for uniformly irradiating a frame of a processed substrate, said processed substrate comprising a plurality of frames, two consecutive frames being separated by an intermediate zone, said method comprises steps of:
  determining an initial position of said processed substrate using a detecting unit,
  comparing said detected initial position with a first predetermined position associated with a first frame of the processed substrate,
  irradiating said first frame of the processed substrate by an irradiation beam emitted by a source unit and scanned by a scanning unit based on the first predetermined position, said irradiation beam being adapted to cover uniformly the whole first frame.

Thanks to the invention, the irradiation is directed to a frame of the processed substrate. As the localization of the frame is known, the invention enables the precise irradiation of the frame. Furthermore, the irradiation is such that the whole frame is uniformly irradiating leading to a best annealing process of the processed substrate.

The present invention thus allows the precise irradiation of the parts of the processed substrate that need to be uniformly irradiated (i.e. the frames) and avoids irradiation of the parts that could be damaged by such irradiation (i.e. edges and intermediate zone).

Other advantageous and non-limiting features of the method according to the invention include:
  the method further comprises a step of moving said processed substrate from said detected initial position to said first predetermined associated with the first frame of the processed substrate;
  the method further comprises a step of moving said scanning unit based on the first predetermined position such that the irradiation beam is directed to the first frame of the processed substrate;
  an optical system is configured such that the irradiation beam is attenuated in the intermediate zone;
  the scanning unit is configured such that the irradiation beam is attenuated in the intermediate zone to more than 80% compared to the irradiation beam covering the first frame;
  the processed substrate comprising at least one reference mark, said step of determining the initial position comprises a step of detecting said at least one reference mark on the processed substrate;
  the processed substrate comprising edges of a peripheral area and a notch, said step of determining the initial position comprises a step of detecting said edges of the peripheral area and said notch on the processed substrate;
  the method further comprises steps of:
    moving the processed substrate from the first predetermined position to a second predetermined position associated with a second frame of the processed substrate, said second frame being directly adjacent to said first frame, and
    irradiating said second frame of the processed substrate by the irradiation beam emitted by the source unit based on the second predetermined position, said irradiation beam being adapted to cover uniformly the whole second frame;
  the method further comprises steps of:
    moving said scanning unit based on a second predetermined position associated with a second frame of the processed substrate, said second frame being directly adjacent to said first frame, and
    irradiating said second frame of the processed substrate by the irradiation beam emitted by the source unit based on the second predetermined position, said irradiation beam being adapted to cover uniformly the whole second frame;

said step of detecting comprises a step of comparing said detected initial position to at least one edge position; and the method also comprises a step of blocking the irradiation of the processed substrate if the initial position corresponds to at least one edge position.

The invention also relates to a system for uniformly irradiating a frame of a processed substrate, said processed substrate comprising a plurality of frames, two consecutive frames being separated by an intermediate zone, said system comprises:

a support designed to bear said processed substrate, a detecting unit configured to determine an initial position of said processed substrate, a control unit configured to compare said detected initial position with a first predetermined position associated with a first frame of the processed substrate, and an scanning unit configured to irradiate said first frame of the processed substrate by emitting an irradiation beam, said irradiation beam adapted to cover uniformly the whole first frame.

Other advantageous and non-limiting features of the system according to the invention include:

the system also comprises a positioning unit configured to move said processed substrate from said detected initial position to a first predetermined position associated with a first frame of the processed substrate;

the system also comprises an overhead moving unit adapted to move the scanning unit based on the first predetermined position such that the irradiation beam is directed to the first frame of the processed substrate;

the system also comprises an optical system which is configured such that the irradiation beam is attenuated in the intermediate zone;

the optical system is configured such that the irradiation beam is attenuated to more than 80% in the intermediate zone compared to the irradiation beam covering the first frame;

an irradiation wavelength of the irradiation beam is lower than 1064 nanometers, preferably equal to or lower than 355 nanometers;

the system also comprises a source unit comprising a laser source; and the system further comprises a vacuum chamber housing the processed substrate and the support.

BRIEF DESCRIPTION OF THE DRAWINGS

The system and method according to the invention will be described next, in reference with the appended drawings.

On the Appended Drawings.

DESCRIPTION OF THE PREFERRED EMBODIMENTS

In the present specification, the expression "uniformly irradiating" a surface means that the conditions of irradiation allow the whole considered surface to be exposed to the same light energy density and exposure duration.

Figure 1:
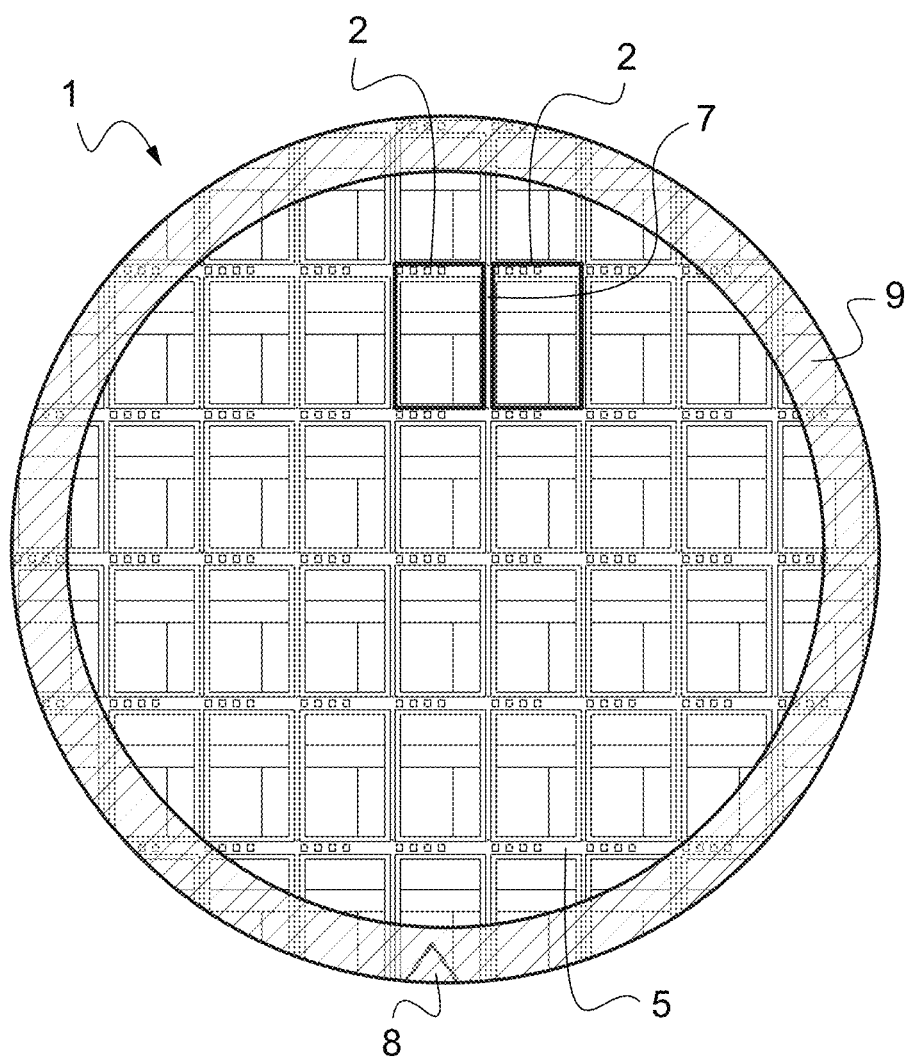
FIG. 1 is a schematic view of an example of a processed substrate.

FIG. 1 shows an example of a processed substrate 1. The processed substrate 1 is typically a silicon wafer or a compound wafer, such as commonly used in the semiconductor devices industries.

Figure 2:
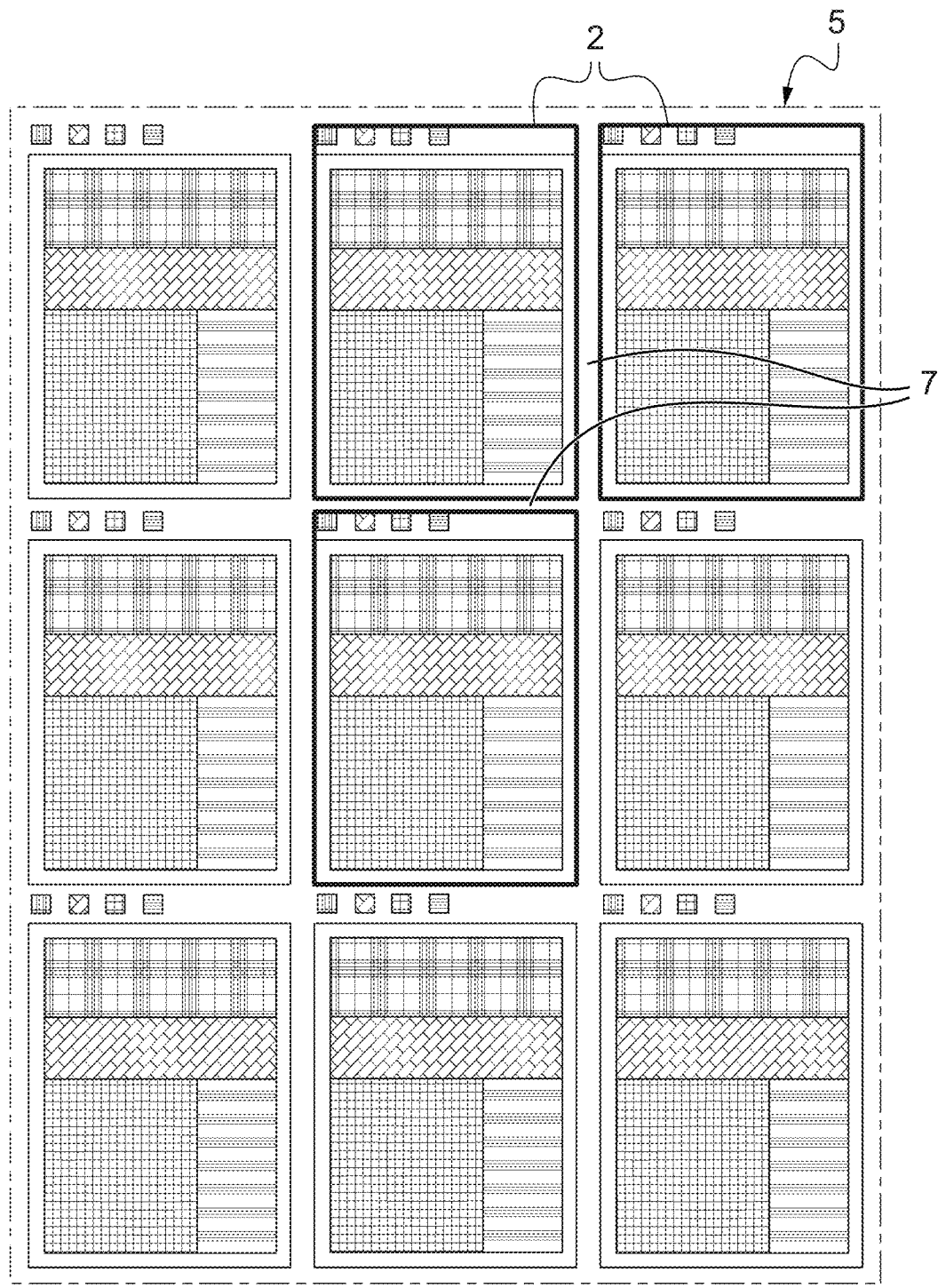
FIG. 2 is a schematic view of frames supported by the processed substrate of FIG. 1.

As visible in FIGS. 1 and 2, the processed substrate 1 supports an array of frames 2 on its processed surface 5. Each frame comprises several areas. Each area of the frame presents specific optical and thermal properties. In other words, each frame comprises active devices, here for example formed by the arrangement of electronic devices such as transistors, resistors and the corresponding metallic interconnects.

Two successive frames are separated by an intermediate zone 7 (FIGS. 1 and 2). This intermediate zone 7 is generally free from active devices as it is generally damaged during the manufacturing of semiconductor devices. Preferably, the width of the intermediate zone 7 is lower than 25 micrometers (μm).

As represented in FIG. 1, the processed substrate 1 also comprises a peripheral area 9 situated on its peripheral edge. The peripheral area 9 is too small to support complete active devices.

FIGS. 3 to 6 represent different embodiments of a system 20; 21; 22; 23 for irradiating uniformly a frame 2 of the processed substrate 1 (particularly the processed surface 5 of the processed substrate 1).

In the following, common elements of the different embodiments represented in FIGS. 3 to 6 are represented, if possible, by the same references and are described in a common way.

As represented in FIGS. 3 to 6, the system 20; 21; 22; 23 comprises a source unit 30. This source unit 30 comprises a light source 31 configures to emit a pulsed light beam 100 towards the processed surface 5 of the processed substrate 1.

The light source 31 is for example an ultraviolet (UV) light source. The light source 31 comprises a laser source. Different types of laser source can be used here. An excimer laser light source can be used here for example. The wavelength of the emitted pulsed light beam 100 is here lower than 1064 nanometers (nm), even lower than 532 nanometers. Preferably, wavelength of the emitted pulsed light beam 100 is equal to or lower than 355 nanometers.

As shown in FIGS. 3 to 6, the source unit 30 also comprises an optical system 33 which is coupled to the light source 31. This optical system 33 is suitable for modifying, controlling or monitoring the emitted pulsed light beam 100. As an example, the optical system 33 is suitable for modulating its fluence. The fluence corresponds to the energy delivered by the light source 31 per unit of area of the processed surface 5 of the processed substrate 1. The optical system 33 is positioned on the beam path between the light source 31 and the processed substrate 1. Fluence is preferably rapidly modulated by the optical system 33. The optical system 33 may be for instance an optical modulator suitable for modulating the transmission of the source unit 30. Finally, in other words, the optical system 33 is suitable for modulating the emitted pulsed light beam 100 with a fast response time. As an example, the response time is faster than 500 nanoseconds, preferably faster than 50 nanoseconds. The modulated light beam 101 outputs from the source unit 30.

The modulated light beam 101 is then directed to a scanning unit 40 (FIGS. 3 to 6). The scanning unit 40 is configured to irradiate the processed surface 5 of the processed substrate 1.

As visible in FIGS. 3 to 6, the scanning unit 40 comprises two mirrors 41, 42. Each mirror is able to be rotated thanks to an associated rotation mechanism 43, 44. The modulated beam 101 is thus reflected by the two mirrors 41, 42 of the scanning unit 40 and outputs a reflected beam 102. The rotation mechanism 43, 44 is suitable for adapting the reflected beam 102 issuing from the two mirrors 41, 42 to the processed substrate 1 and the aimed irradiation of the processed surface 5.

The scanning unit is for example a standard galvo scanner system. As a variant, the scanning unit can be a polygon scanner system. As another variant, the scanning unit can be a combination of polygons and mirrors.

The scanning unit 40 also comprises an optical system 47. The optical system 47 is positioned between the two mirrors 41, 42 and the processed substrate 1. In complement to the source unit 30, the optical system 47 is configured to focus the reflected beam 102 on the processed surface 5 of the processed substrate 1. The optical system 47 is for example here a telecentric lens.

An irradiation beam 105 outputs from the scanning unit 40. In order to obtain a localized irradiation, the irradiation beam 105 has here an irradiation wavelength lower than 1064 nanometers (nm), even lower than 532 nanometers. Preferably, this irradiation wavelength is equal to or lower than 355 nanometers.

Advantageously, the scanning unit 40 is configured to emit the irradiation beam 105 with an adapted shape and size in order to perform the objectives of the present invention. More particularly, the scanning unit 40 is configured to scan the irradiation beam 105 in order to uniformly irradiate one frame of the processed surface 5 of the processed substrate 1.

Combined with the scanning unit 40, the optical system 33 is configured such that the irradiation beam 105 is attenuated in transmitted energy in the intermediate zone 7 of the processed substrate 1. The irradiation beam is for example attenuated from 0% to more than 80% in the intermediate zone 7 compared to the irradiated beam covering the frame 2 of the processed substrate 1. The optical system 33 is also configured such that the irradiation beam 105 is for example attenuated from 80% to almost 100% in the adjacent frames.

The attenuation in the optical system 33 is performed by modifying the transmission of the light beam by different physical means (and the associated physical phenomena). Different examples of physical means can be cited: sound waves that modify the optical properties of the material, electro-absorption modulation and electro-optic system in order to apply a voltage to modify the optical properties of the material or magneto-optic modulation that modifies the light propagation by applying a magnetic field on the material.

In practice, the attenuation in the optical system 33 is for example performed by an acousto-optic modulator, an electro-absorption modulator, an electro-optic modulator, a magneto-optic modulator or micro and nano electro-mechanical devices (MEMS and NEMS).

Considering a Gaussian or a hat profile, the dimensions of the irradiation beam 105 are for example higher than 20 micrometers (μm) in one direction and higher than 20 micrometers in the other direction.

The processed surface 5 is here irradiated by a micro-spot associated with the irradiation beam 105. In other words, the scanning system 40 is configured to scan the processed substrate 1 with the irradiation beam 105 for example a circular surface of the processed substrate 1 with a diameter wider than 33 millimeters (mm).

Here, the largest surface irradiated by the irradiation beam 105 corresponds to the surface of the frame 2. The surface of the frame is equal to or smaller than 26×33 $mm^2$.

Finally, the scanning unit 40 is configured to emit the irradiation beam 105 with specific parameters: for example, at a given location, the irradiation time is shorter than 30 microseconds (μs), even shorter than 1 microsecond. Preferably, the irradiation beam 105 is shorter than 1 nanosecond.

As represented in FIGS. 3 to 6, the system 21; 22; 23; 24 comprises a support 50 designed to bear the processed substrate 1.

Figure 4:
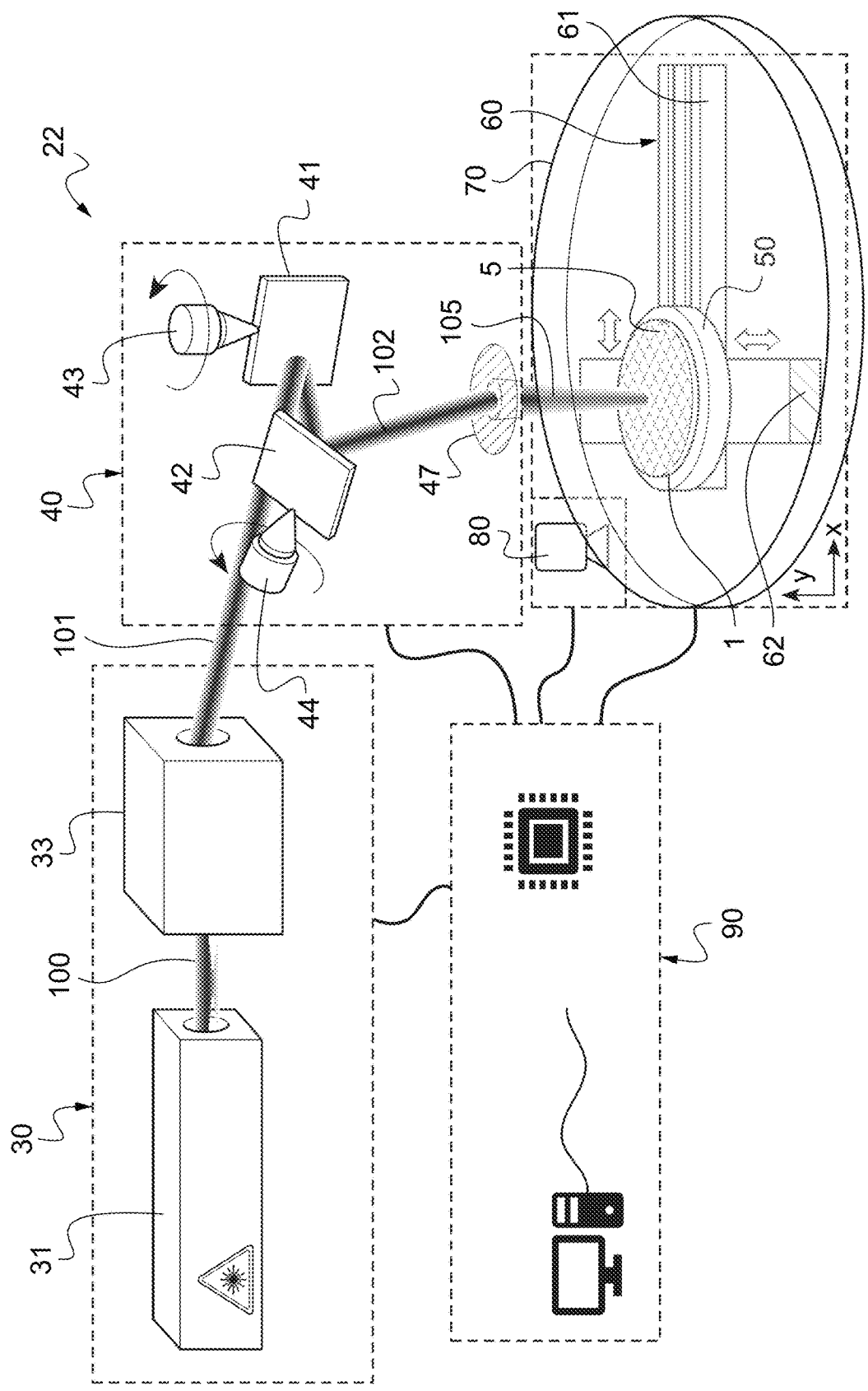
FIG. 4 represents a second embodiment of a system for uniformly irradiating a frame of the processed substrate according to the invention.
Figure 6:
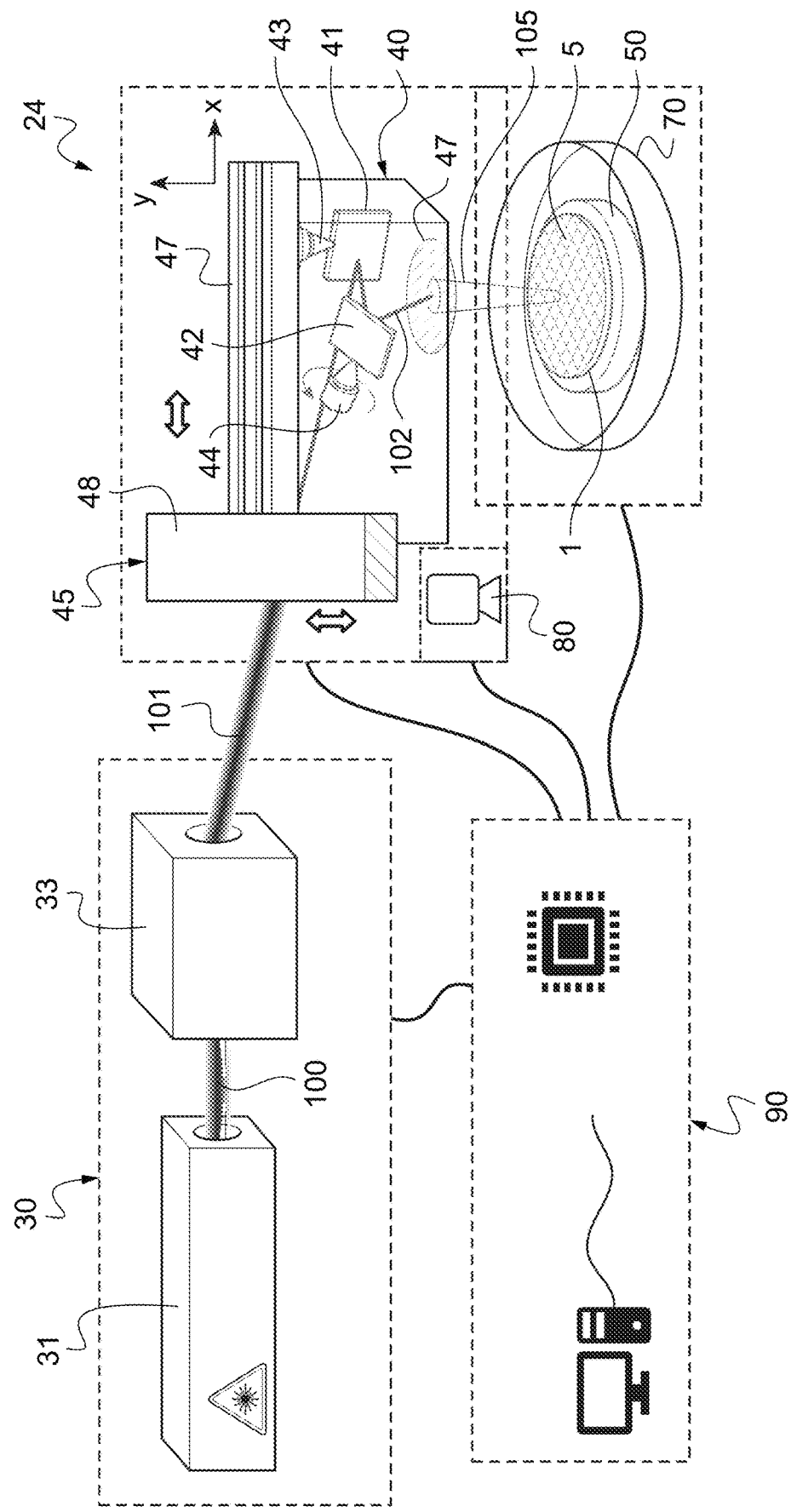
FIG. 6 represents a fourth embodiment of a system for uniformly irradiating a frame of the processed substrate according to the invention.

As an alternative represented in FIGS. 4 and 6, the system 22; 24 comprises a vacuum chamber 70 housing the processed substrate 1 and the support 50. The vacuum chamber 70 is suitable for controlling the environment of irradiation of the processed substrate 1.

The system 21; 22; 23; 24 also comprises a detecting unit 80. The detecting unit 80 is suitable for determining the position of the processed substrate 1 on the support 50. The detecting unit 80 comprises here a pattern camera and an associated pattern recognizing algorithm suitable for identifying and localizing a reference mark on the processed surface 5 of the processed substrate 1. The reference mark is for example a specific local pattern or a notch 8 formed on the processed surface 5 of the processed substrate 1 (FIG. 1).

The pattern camera is for example based on visible light (wavelength comprised between 400 and 800 nanometers) or on infrared light (wavelength higher than 800 nanometers). The pattern camera based on visible light is preferably used for a reference mark on the processed surface 5 of the processed substrate 1. The pattern camera based on infrared light is for example used for a reference mark on a buried surface or on the opposite surface of the processed surface 5.

The data from the detecting unit 80 are then used in order to match the position of the to-be-irradiated frame and the irradiation beam 105 (or the corresponding exposure position). Two alternatives are considered in the present invention to perform a movement.

Figure 3:
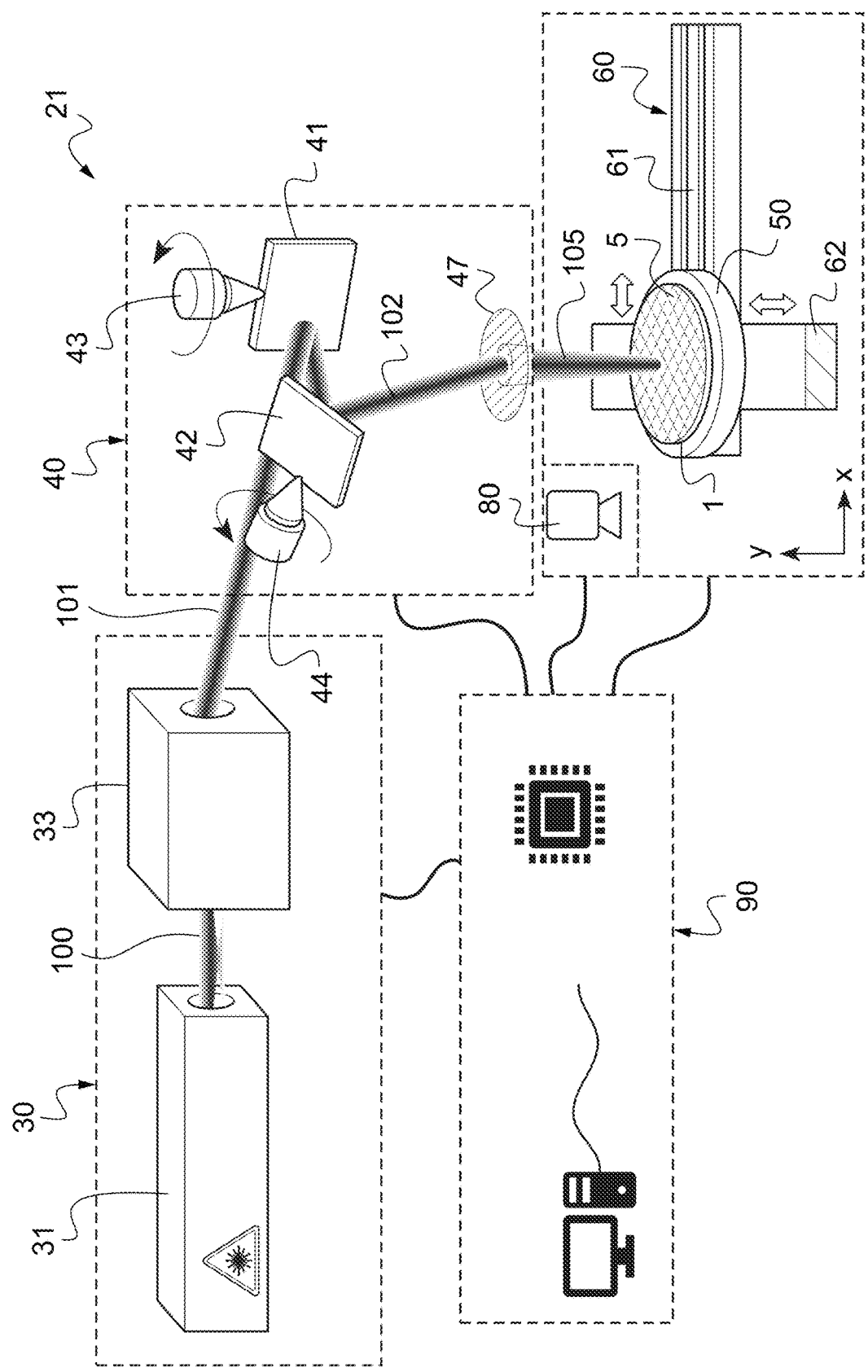
FIG. 3 represents a first embodiment of a system for uniformly irradiating a frame of the processed substrate according to the invention.

FIGS. 3 and 4 represent the first alternative, in which the support (and thus the to-be-irradiated frame of the processed substrate 1) is moved in order to match the frame 2 and the exposure position.

In this case, the system 21; 22 further comprises a positioning unit 60 suitable for moving the support 50 bearing the processed substrate 1. As visible in these Figures, the positioning unit 60 comprises two moving stages 61, 62 along the two axes x, y adapted to move the support 50 (thus the processed substrate 1) respectively in the x and y directions. The positioning unit 60 is able to move the support from a distance higher than 300 millimeters in the y direction and a distance higher than 200 millimeters in the x direction.

In practice, the positioning unit 60 is adapted to move the processed substrate 1, step by step, from a frame 2 to another, corresponding here to a moving distance comprised between 20 and 36 millimeters in both directions.

The precision associated with the positioning unit 60 is lower than 5 micrometers, preferably lower than 1 micrometer.

Figure 5:
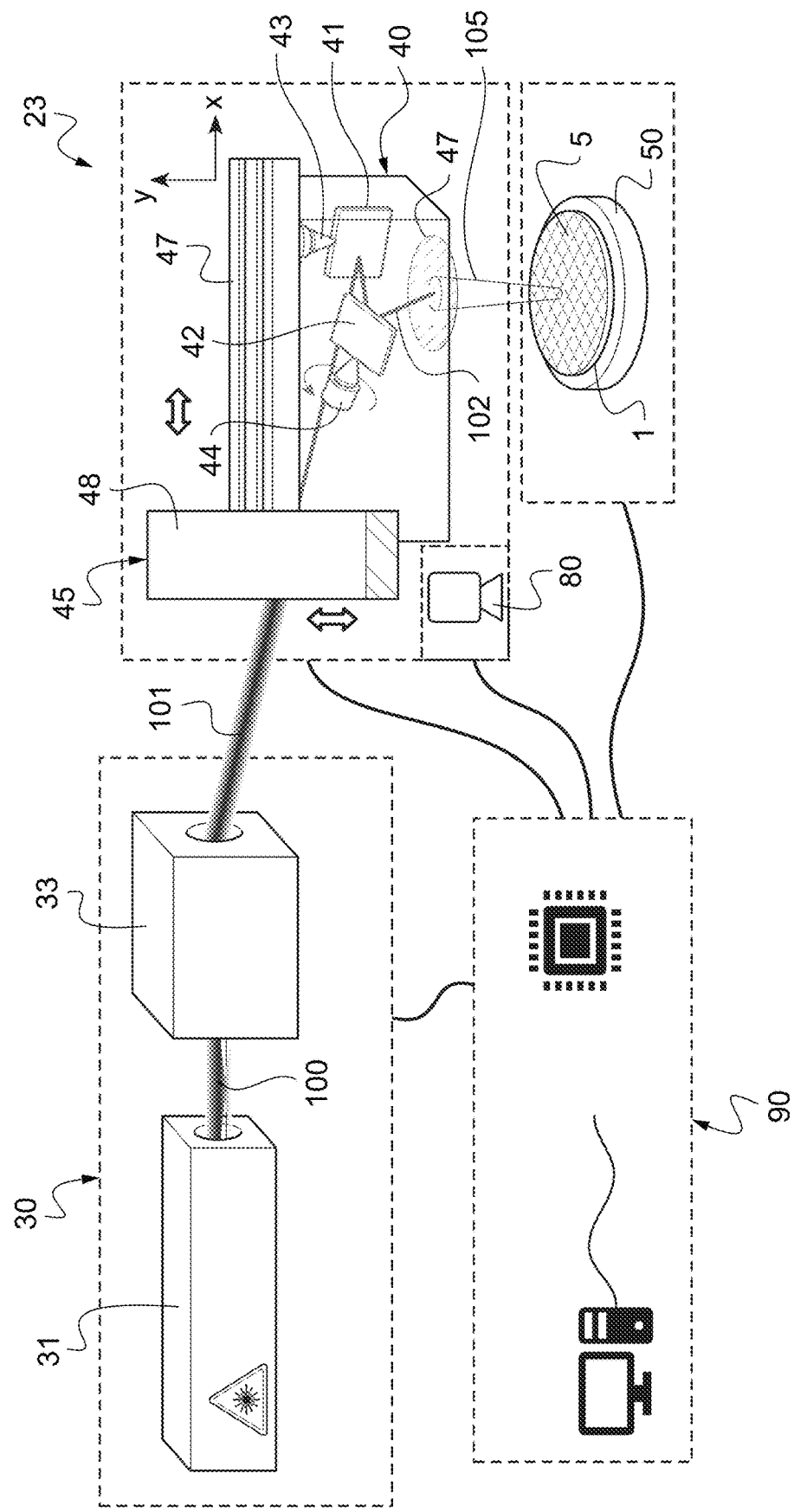
FIG. 5 represents a third embodiment of a system for uniformly irradiating a frame of the processed substrate according to the invention.

According to FIGS. 5 and 6, the second alternative consists in moving the irradiation beam 105 (and thus the position of the corresponding micro-spot on the processed surface 5) instead of moving the processed substrate 1.

The system 23; 24 here comprises an overhead moving unit 45 suitable for moving the scanning unit 40 in order to move the position of the micro-spot of the irradiation beam 105 on the processed surface 5 of the processed substrate 1.

The overhead moving unit 45 comprises two moving parts 47, 48 adapted to move the scanning unit 40 respectively in the x and y directions. By moving the scanning unit 40 in the x or/and y directions, the overhead moving unit 45 thus allows moving the micro-spot of the irradiation beam 105 in the x and y directions in order to overlay the considered frame (i.e. the one to irradiate) of the processed surface 5 of the processed substrate 1.

The precision associated with the overhead moving unit 45 is lower than 5 micrometers, preferably lower than 1 micrometer.

In this configuration (with the overhead moving unit 45), the optical system 33 is thus able to adjust the modulated beam 101 at every moving step of the scanning unit 40.

As an alternative (not represented), the system can comprise both the positioning unit and the overhead moving unit, thus enabling moving respectively the support and the scanning unit. This alternative is particularly advantageous for very large processed substrates such as flat display panel with diameters higher than one meter.

As another alternative, the detection unit can be adapted to determine a rotation error. In this case, the support is able to rotate in order to compensate this error. The rotation movement is for example in the range of 2 degrees.

The system 21; 22; 23; 24 also comprises a control unit 90 which controls the interaction of the different parts of the system 21; 22; 23; 24. In particular, the control unit 90 synchronizes the different parts of the system 21; 22; 23; 24.

This control unit 90 includes a microprocessor and a memory. The memory stores instructions that allow the system 21; 22; 23; 24 to implement a method for uniformly irradiating the frame 2 of the processed substrate 1 as described below when these instructions are executed by the microprocessor.

Figure 7:
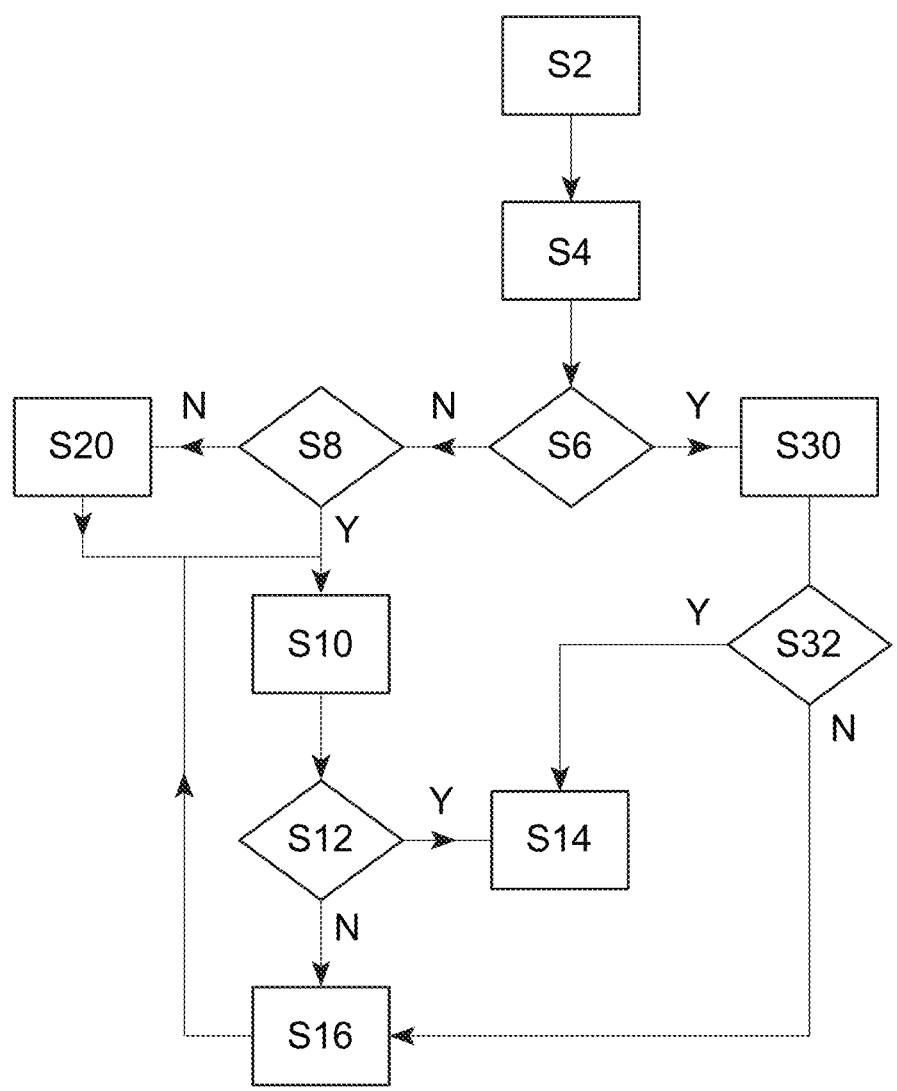
FIG. 7 shows an exemplary flowchart corresponding to a method for uniformly irradiating a frame of the processed substrate according to the invention.

FIG. 7 shows an exemplary flowchart corresponding to the method for uniformly irradiating the frame of the processed substrate according to the invention.

As represented in FIG. 7, this method comprises a step S2 of positioning the processed substrate 1 on the support 50. During this step S2 of positioning the processed substrate 1, the exact position of the processed substrate 1 is not known.

In order to uniformly irradiate each frame of the processed surface 5 of the processed substrate 1, the position of the processed substrate 1 needs to be determined.

The method thus comprises a step S4 of determining an initial position of the processed substrate 1. In practice, at step S4, the detecting unit 80 is adapted to detect one reference mark on the processed surface 5 of the processed substrate 1. Based on the detection of this reference mark, the control unit 90 is able to determine the initial position of the processed substrate 1.

As an alternative, if the processed surface does not comprise a reference mark, the position of the edges of the peripheral are 9 of the processed substrate 1 and particularly the position of the notch 8 can be used to determine the position of the processed substrate 1.

In practice, the detecting unit 80 evaluates a positioning unit by comparing the theoretical (expected) position of the reference mark and the detected one. This positioning error is then used by the control unit 90 to determine the initial position of the processed substrate 1.

At step S6, the control unit 90 then compares the detected initial position to an edge position. The edge position is localized in the peripheral area 9.

If the detected initial position does not correspond to an edge position, the step S8 is implemented leading to the irradiation of the processed surface 5 of the processed substrate 1. It is possible to assume here that, before the execution of the method according to the invention, the control unit 90 memorizes instructions in order to irradiate all the frames of the processed surface 5 of the processed substrate 1. These instructions for example comprise the order of the frames to irradiate. It is considered here that the previously named "to-be-irradiate frame" is for example the current frame to irradiate.

At step S8, the control unit 90 thus compares the detected initial position to a first predetermined position corresponding to the to-be-irradiated frame.

If the detected initial position matches with the first predetermined position, it means that the micro-spot of the irradiating beam 105 is directed to the considered frame (which is the first one to be irradiated in the stored instructions).

The method then comprises a step S10 of irradiating the considered frame by the irradiation beam 105. The irradiation beam 105 is controlled by the scanning unit 40 such that it irradiates uniformly the whole considered frame.

In practice, the considered frame receives the transmitted energy whereas in the intermediate zone 7, the irradiation beam 105 is attenuated (meaning that the transmitted energy is lower than the one transmitted to the frame).

As an example, in the intermediate zone 7, the irradiation beam 105 is attenuated to more than 80% compared the irradiation beam 105 which covers the considered frame. Preferably, the irradiation beam 105 is completely attenuated in the intermediate zone 7.

As a consequence, the irradiation beam 105 is also attenuated in the surrounding frames of the considered irradiated frame (attenuation to more than 80% and preferably completely attenuated).

Advantageously according to the invention, the irradiation step is accurate and localized on the considered frame, thus allowing a uniform irradiation of this frame.

The method then continues with step S12 in which the control unit 90 determined if all frames has been irradiated. If it is the case, the processed substrate 1 is annealed. The control unit 90 sends (step S14) an instruction to remove the processed substrate 1 from the support 50 in order to complete the preparation of the processed substrate 1 and obtain final products.

If some frames have not been irradiated, as visible in FIG. 7, the method comprises a step S16 of moving the micro-spot of the irradiation beam 105 from the first predetermined position to a second predetermined position associated with the following frame to irradiate (according to the order of irradiation of the stored instructions).

Two alternatives can be considered to move the micro-spot of the irradiation beam 105 in order to direct the irradiation beam to the frame associated with the second predetermined position.

The first solution is to move the support 50 bearing the processed substrate thanks to the positioning unit 60. The control unit 90 thus controls the positioning unit 60 in order to match the micro-spot of the irradiation beam with the second predetermined position.

The second solution is to directly move the position of the micro-spot of the irradiation beam 105 on the processed surface 5 of the processed substrate 1 by moving the scanning unit 40 thanks to the overhead moving unit 45. In this case, the control unit 90 controls the overhead moving unit 45 to move the scanning unit 40 in order to match the micro-spot of the irradiation beam with the second predetermined position.

When the step S16 is performed resulting in matching the micro-spot of the irradiation beam 105 with the second predetermined position on the processed surface 5 of the processed substrate 1, the method goes back to steps S10, S12, S14 and S16 as previously described.

If, at step S8, the detected initial position is different from the first predetermined position, this point means that the irradiation beam is not directed to the frame to irradiate according to the stored instructions. The method thus continues at step S20 of moving the micro-spot of the irradiation beam 105 in order to direct the irradiation beam 105 to the frame associated with the first predetermined position.

As previously described the two alternatives can be used here to match the micro-spot of the irradiation beam 105 with the first predetermined position.

When the step S20 is performed, the method continues with the step S10 of irradiating the considered frame and the following steps as represented in FIG. 7.

If, at step S6, the detected initial position corresponds to an edge position, the control unit 90 controls the optical system 33 in order to attenuate or even block the irradiation of the processed surface 5 of the processed substrate 1 (step S30). In other words, the peripheral edge 9 is not directly irradiated by the irradiation beam 105.

As visible in FIG. 7, the method continues with step S32 of determining if all the frames have been irradiated (step S32).

If it is the case, the processed substrate 1 is annealed. The control unit 90 sends (step S14 previously described) an instruction to remove the processed substrate 1 from the support 50 in order to complete the preparation of the processed substrate 1 and obtain final products.

If some frames have not been irradiated, the method continues at step S16.

Finally, this method stops when each frame of the processed surface 5 of the processed substrate has been uniformly irradiated. The control unit 90 is configured to implement this method on the whole processed surface 5 of the processed substrate 1, frame after frame, according to the stored instructions of irradiation.

The invention claimed is:

1. A method for uniformly irradiating a frame of a processed substrate, said processed substrate comprising a plurality of frames, two consecutive frames being separated by an intermediate zone, said method comprises steps of:
    determining an initial position of said processed substrate using a detecting unit,
    comparing said detected initial position with a first predetermined position associated with a first frame of the processed substrate,
    irradiating said first frame of the processed substrate by an irradiation beam emitted by a source unit and scanned by a scanning unit based on the first predetermined position, said irradiation beam being adapted to cover uniformly the whole first frame.

2. The method according to claim 1, further comprising a step of moving said processed substrate from said detected initial position to said first predetermined associated with the first frame of the processed substrate.

3. The method according to claim 1, further comprising a step of moving said scanning unit based on the first predetermined position such that the irradiation beam is directed to the first frame of the processed substrate.

4. The method according to claim 1, wherein an optical system is configured such that the irradiation beam is attenuated in the intermediate zone.

5. The method according to claim 1, wherein the scanning unit is configured such that the irradiation beam is attenuated in the intermediate zone to more than 80% compared to the irradiation beam covering the first frame.

6. The method according to claim 1, wherein, the processed substrate comprising at least one reference mark, said step of determining the initial position comprises a step of detecting said at least one reference mark on the processed substrate.

7. The method according to claim 1, wherein, the processed substrate comprising edges of a peripheral area and a notch, said step of determining the initial position comprises a step of detecting said edges of the peripheral area and said notch on the processed substrate.

8. The method according to claim 1, further comprising steps of:
    moving the processed substrate from the first predetermined position to a second predetermined position associated with a second frame of the processed substrate, said second frame being directly adjacent to said first frame, and
    irradiating said second frame of the processed substrate by the irradiation beam emitted by the source unit based on the second predetermined position, said irradiation beam being adapted to cover uniformly the whole second frame.

9. The method according to claim 1, further comprising steps of:
    moving said scanning unit based on a second predetermined position associated with a second frame of the processed substrate, said second frame being directly adjacent to said first frame, and
    irradiating said second frame of the processed substrate by the irradiation beam emitted by the source unit based on the second predetermined position, said irradiation beam being adapted to cover uniformly the whole second frame.

10. The method according to claim 1, wherein said step of detecting comprises a step of comparing said detected initial position to at least one edge position.

11. The method according to claim 10, also comprising a step of blocking the irradiation of the processed substrate if the initial position corresponds to at least one edge position.

* * * * *